US007227352B2

(12) United States Patent
Aoyagi et al.

(10) Patent No.: US 7,227,352 B2
(45) Date of Patent: Jun. 5, 2007

(54) CONTACT PROBE, MEASURING PAD USED FOR THE CONTACT PROBE, AND METHOD OF MANUFACTURING THE CONTACT PROBE

(75) Inventors: Masahiro Aoyagi, Tsukuba (JP);
Hiroshi Nakagawa, Tsukuba (JP);
Kazuhiko Tokoro, Tsukuba (JP);
Katsuya Kikuchi, Tsukuba (JP);
Yoshikuni Okada, Tsukuba (JP);
Shigeo Kiyota, Tokyo (JP)

(73) Assignees: National Institute of Advanced Industrial Science and Technology, Tokyo (JP); Kiyota Manufacturing Co., Tokyo (JP)

( * ) Notice: Subject to any disclaimer, the term of this patent is extended or adjusted under 35 U.S.C. 154(b) by 0 days.

(21) Appl. No.: 11/602,240

(22) Filed: Nov. 21, 2006

(65) Prior Publication Data
US 2007/0065956 A1    Mar. 22, 2007

Related U.S. Application Data

(62) Division of application No. 11/136,572, filed on May 25, 2005.

(30) Foreign Application Priority Data
May 27, 2004    (JP)    ............................ 2004-156983
Apr. 13, 2005    (JP)    ............................ 2005-115988

(51) Int. Cl.
*G01R 31/02*    (2006.01)
*H01R 43/00*    (2006.01)
(52) U.S. Cl. .................................... 324/158.1; 29/825
(58) Field of Classification Search ..................... None
See application file for complete search history.

(56) References Cited

U.S. PATENT DOCUMENTS 7,145,323 B2 *   12/2006   Van Horn et al. ........ 324/158.1
2003/0122565 A1 *   7/2003   Van Horn et al. .......... 324/754

OTHER PUBLICATIONS

"Picoprobe" GGB Industries Inc. Model 40A, four pages, Mar. 1999.*
Katsuya Kikuchi et al., "Fabrication of High-Density Wiring Interposer for . . . " Japanese Journal of Applied Physics, vol. 43, No. 7A, pp. 4141-4145, 2004.
Katsuya Kikuchi et al., "Fabrication of High-Density Wiring Interposer for . . . " Extended Abstracts of the 2003 International Conference on Solid State Devices and Materials, pp. 382-383.

* cited by examiner

*Primary Examiner*—Paresh Patel
(74) *Attorney, Agent, or Firm*—Westerman, Hattori, Daniels & Adrian, LLP.

(57) ABSTRACT

There is provided a contact probe that is smaller than 50 μm in a pitch between a signal electrode and a ground electrode and can correctly conduct a high-speed high-frequency measurement, a measuring pad used for the contact probe, and a method of manufacturing the contact probe. The contact probe includes: a tip member having a signal electrode $10a$ and a ground electrode $11a$ that are put into contact with an object to be measured; and a coaxial cable 1 having a core $1b$ electrically connected to the signal electrode $10a$ and an outer covering conductor $1a$ electrically connected to the ground electrode $11a$, wherein the tip member is formed on a printed wiring board 2, and wherein the signal electrode $10a$ and the ground electrode $11a$ are constructed of fine coplanar strip lines formed on an insulating board $2a$.

2 Claims, 11 Drawing Sheets

CONTACT PROBE, MEASURING PAD USED FOR THE CONTACT PROBE, AND METHOD OF MANUFACTURING THE CONTACT PROBE

BACKGROUND OF THE INVENTION

1. Field of the Invention

The present invention relates to a contact probe used for measuring and evaluating the high-speed high-frequency characteristics of a semiconductor integrated circuit, a package for a semiconductor integrated circuit, a printed circuit board, and the like, and a measuring pad used for the contact probe, and a method for manufacturing the contact probe.

2. Description of the Related Art

In recent years, semiconductor integrated circuit (LSI) chips in electronic devices have been remarkably improved in the performance. With this, a clock frequency ranging from 3 GHz to 5 GHz is becoming a standard for a CPU. Further, a transmission speed in the packaging system of an electronic device reaches 500 Mbps to 1 Gbps although the growth of improvement in performance is slowing.

Further, to increase the speed and to decrease the size of an electronic device, a high-density packaging technology has received attention and the research and development of the high-density packaging technology have been actively conducted. For example, in "Fabrication of High-Density Wiring Interposer for 10 GHz 3D Packaging Using a Photosensitive Multiblock Copolymerized Polyimide" (Katsuya Kikuchi, Eun-Sil Jung, Shigemasa Segawa, Yoshihiko Nemoto, Hiroshi Nakagawa, Kazuhiko Tokoro, and Masahiro Aoyagi; Extended Abstracts of 2003 International Conference on Solid State Devices and Materials, pp. 382–383, 2003) is disclosed a report on an integrated circuit interposer that can be connected to fine bumps of a minimum pitch of 20 μm so as to laminate and package a three-dimensional semiconductor integrated circuit chip. Here, the interposer means a kind of LSI package used for mounting an LSI chip on a circuit board.

Under the above-described circumstances, a high-frequency contact probe developed for ultra-high speed signal measurement and evaluation in a microwave region has been conventionally used for high-speed high-frequency characteristics in LSIs, chip mounting packages, circuit boards, and the like.

However, an inter-electrode pitch (a pitch between a signal electrode and a ground electrode) at the tip of the probe that is conventionally widely used is approximately 100 μm even if it is the finest.

Further, the finest inter-electrode pitch of a commonly available probe (made by GGB Co., (U.S.A.) or Cascade Microtech Corp. (U.S.A.) is 50 μm.

Because even a minimum inter-electrode pitch of a conventional high-frequency contact probe is 50 μm, the characteristics of the interposer for the integrated circuit having a fine pitch of 20 μm cannot be directly evaluated. Hence, it has been desired that a contact probe having a smaller inter-electrode pitch will be developed.

SUMMARY OF THE INVENTION

The present invention has been made under the above-described circumstances. The object of the invention is to provide a contact probe that is smaller than 50 μm in a pitch between a signal electrode and a ground electrode and can correctly conduct a high-speed high-frequency measurement, a measuring pad used for the contact probe, and a method of manufacturing the contact probe.

A contact probe in accordance with the present invention that is invented so as to solve the above problem is a contact probe that is used for measuring and evaluating high-speed high-frequency characteristics and includes: a tip member having a signal electrode and a ground electrode that are put into contact with an object to be measured; and a coaxial cable having a core electrically connected to the signal electrode and an outer covering conductor electrically connected to the ground electrode, and is characterized in that the tip member is formed on a printed wiring board and in that the signal electrode and the ground electrode are constructed of fine coplanar strip lines formed on the board.

Here, it is preferable that an inter-electrode pitch between the signal electrode and the ground electrode be formed in a size of from 10 μm or more to 50 μm or less.

In this manner, a tip member including the signal electrode and the ground electrode that are put into contact with an object to be measured is made of a printed wiring board. Hence, a circuit pattern forming technology used for a printed wiring board can be employed and hence the inter-electrode pitch between the signal electrode and the ground electrode can be made smaller than 50 μm.

As a result, the characteristics of an interposer for an integrated circuit having a fine pitch of, for example, 20 μm can be evaluated with ease and with high accuracy.

Further, it is preferable that a positioning guide line showing the center position of the signal electrode and the ground electrode be formed on the reverse surface of the board on which the signal electrode and the ground electrode are formed.

By forming the positioning guide line in this manner, it is possible to position the tip of the probe with ease.

Still further, it is preferable that the tip member has a ground line formed opposite to the ground electrode across the signal electrode.

By forming the tip member in this manner, it is possible to stabilize the impedance of a signal line in the signal electrode at a low level and hence to measure a signal from a contact electrode with more accuracy.

Still further, it is preferable that the ground electrode is formed to the same tip position as the signal electrode, and that the ground line is formed in a length shorter than the tip position of the signal electrode.

By forming the ground electrode and the ground line in this manner, it is possible to prevent the ground line from interfering with (being put into contact with) an object to be measured when the contact electrodes are put into contact with the object to the measured.

Still further, it is preferable that a measuring pad disposed between the contact probe and an object to be measured includes: the first bonding pad that has one of the signal electrode and the ground electrode printed thereon so as to be put into contact with each other; and the second bonding pad that has the other of the signal electrode and the ground electrode printed thereon so as to be put into contact with each other, and is characterized in that the first bonding pad is formed along the direction of an inter-electrode pitch between the signal electrode and the ground electrode in a width of 1.5 to 3 times as large as the inter-electrode pitch, and in that the second bonding pad is formed in a width of 0.5 times or less of the inter-electrode pitch, and in that a pitch between the first bonding pad and the second bonding pad is 0.5 times or less of the inter-electrode pitch.

Because the first bonding pad is formed in a large size in this manner, it is possible to find the position of the first bonding pad at the time of observing it with a microscope and hence to easily find a gap between the first bonding pad and the second bonding pad by searching the gap with attention concentrated along the contour line of the first bonding pad. Further, because the width of the first bonding pad is formed in a larger size than the inter-electrode pitch of the probe, even if the tip of the contact probe is slightly shifted in position when it is pressed onto the measuring pad, it is possible to put the tip of the contact probe (contact electrode) into correct contact with the pad for measurement.

Still further, a method of manufacturing a contact probe in accordance with the present invention is a method of manufacturing a contact probe used for measuring and evaluating high-speed high-frequency characteristics, and is characterized by the steps of: manufacturing a printed wiring board on which wirings of a signal electrode and a ground electrode, which are put into contact with an object to be measured, are formed; and electrically connecting the signal electrode to the core of a coaxial cable and electrically connecting the ground electrode to the outer covering conductor of the coaxial conductor.

In this manner, a tip member having a signal electrode and a ground electrode, which are put into contact with an object to be measured, are made of the printed wiring board. Hence, it is possible to form an inter-electrode pitch between the signal electrode and the ground electrode with ease and precision by a circuit pattern forming technology used for the printed wiring board.

This printed wiring board can be formed by the steps of: roughening and catalyzing the surface of an insulating resin board; forming a nonelectrolytic copper-plated film over the whole surface of the roughened and catalyzed board after the above-described step; forming a resist pattern for forming a fine wiring by a lithography process after the step of forming the film; forming an electrolytic copper-plated film on the nonelectrolytic copper-plated film, on which the resist pattern is not formed, after the step of forming a resist pattern for forming a fine wiring; removing the resist pattern after the step of forming an electrolytic copper-plated film to expose the nonelectrolytic copper-plated film and the electrolytic copper-plated film, which become copper fine wirings; and etching off an unnecessary nonelectrolytic copper except for the copper fine wirings after the above-described step.

Still further, in the step of manufacturing the printed wiring board, an inter-electrode pitch between the signal electrode and the ground electrode is formed in a size of from 10 µm or more to 50 µm or less.

According to this method, it is possible to manufacture a contact probe that can be pressed onto a fine pitch of from 10 µm or more to 50 µm or less, which is formed on a semiconductor integrated circuit, a package for a semiconductor integrated circuit, a printed circuit board, and the like.

BRIEF DESCRIPTION OF THE DRAWINGS

FIG. 2 shows a state where the contact probe in FIG. 1 is assembled.

DETAILED DESCRIPTION OF THE PREFERRED EMBODIMENTS

Hereafter, the preferred embodiments of the present invention will be described on the basis of the drawings. FIG. 1 is a plan view and a side view showing the whole of a contact probe in accordance with the present invention. FIGS. 2A to 2D are views showing a state where the contact probe in FIG. 1 is assembled, and FIGS. 2A to 2C are plan views and FIG. 2D is a front view.

Figure 1A:
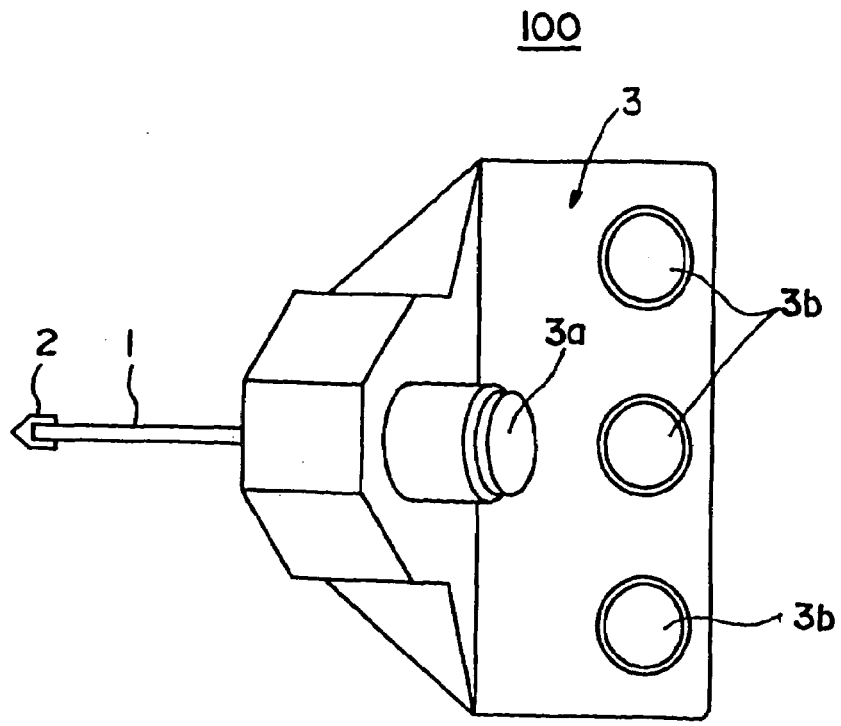
FIG. 1 is a plan view and a side view showing the whole of a contact probe in accordance with the present invention.
Figure 1B:
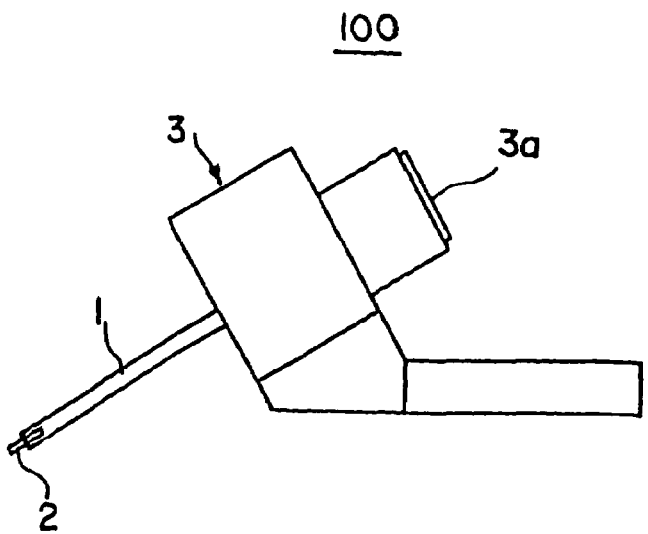
Figure 2A:
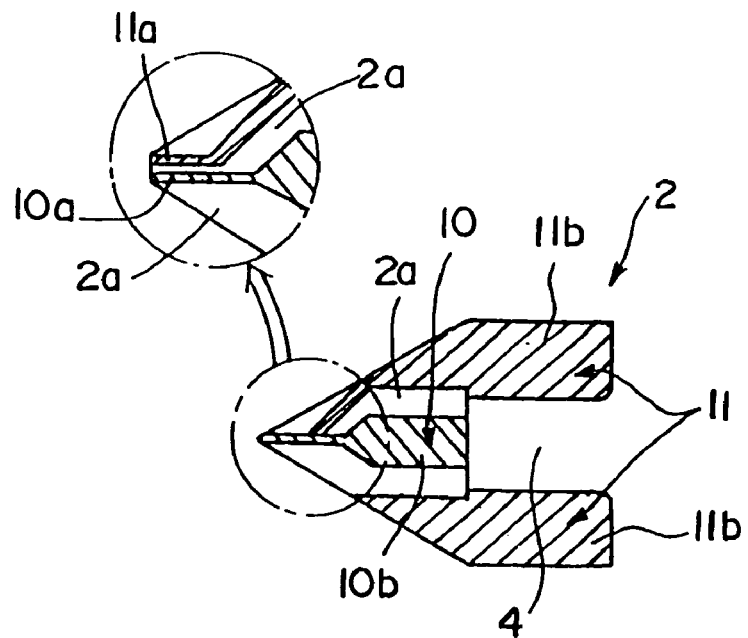
FIGS. 2A to 2C are plan views and FIG. 2D is a front view.
Figure 2B:
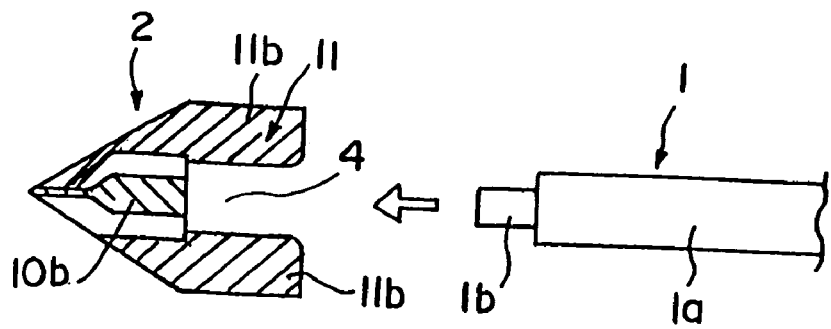
Figure 2C:
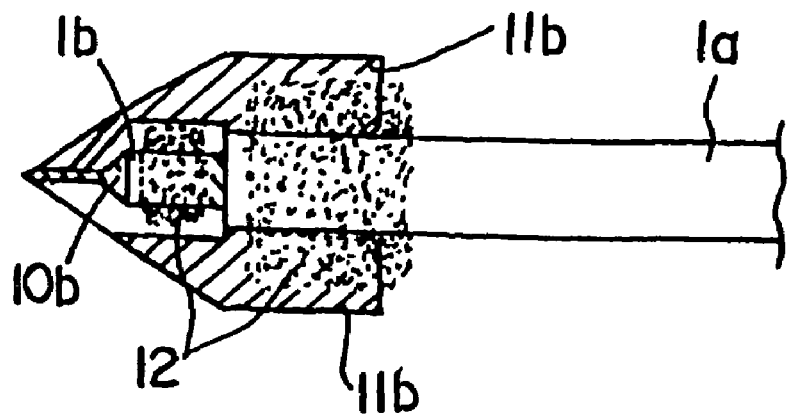
Figure 2D:
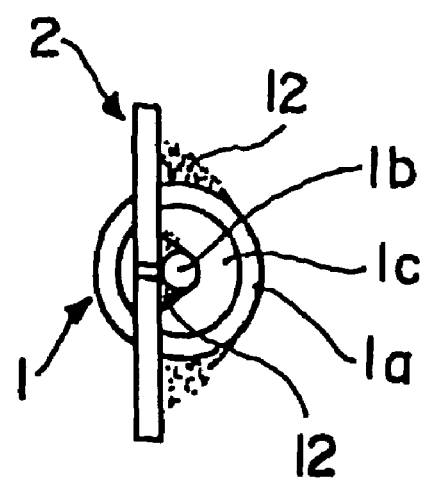

As shown in the plan view in FIG. 1A and in the side view in FIG. 1B, this contact probe 100 is constructed of a semi-rigid type coaxial cable having a predetermined hardness and irreversibility to bending, a printed wiring board 2 as a probe tip member, which is mounted on the tip of the coaxial cable 1, and an attachment 3 to which the other end of the coaxial cable 1 is attached.

On the printed wiring board 2, contact electrodes (signal electrode, ground electrode) that are put into contact with an object to be measured are formed as fine coplanar strip wirings. That is, the signal electrode and the ground electrode that are contact electrodes are formed as copper fine wirings and are arranged in parallel on the same plane of the board.

Further, an electric signal inputted (or detected) from the contact electrode is configured to be outputted to the female coaxial connector 3a of the attachment 3 via the coaxial cable 1.

Here, the female coaxial connector 3a is connected to a coaxial cable (not shown) with male coaxial connectors. The cable is used for connecting to a high-frequency measuring device (not shown). Mounting openings 3b formed in the attachment 3 are used for mounting a contact probe 100 on a probe inching mechanism (not shown) with bolts or the like.

Next, a probe tip will be described on the basis of FIG. 2. As shown in a plan view in FIG. 2A, in the printed wiring board 2, ground lines 11 are formed across a signal line 10 and a cutout space 4 on an insulating resin board 2a.

Further, in a contact portion to be put into contact with an object to be measured, which is shown in an partial enlarged view in FIG. 2A, the contact electrodes (signal electrode 10a, ground electrode 11a) are formed in a width of 10 µm, respectively, and a pitch between the electrodes is formed in 20 µm. Here, as for the probe tip shown in FIG. 2A, a construction may be also employed in which the probe tip is flipped from top to bottom, that is, the ground electrode 11a and the signal electrode 10a are opposite to each other in position.

Further, on the reverse surface of the board 2 on which two electrode lines of the signal line 10a and the ground electrode 11a are formed, a positioning guide line (not shown) is shown and formed at the center of the two electrode lines. That is, at the time of measurement, the probe tip is positioned by using this positioning guide line. This positioning guide line can be formed by the same method as a method of forming the signal electrode 10a and the ground electrode 11a, or by scratching out a groove.

On the other hand, as shown in FIG. 2B, the tip of the coaxial cable 1 is formed such that its core 1b is protruded from its outer covering conductor 1a. As described above, the coaxial cable 1 is a semi-rigid type cable and, as shown in FIG. 2D, the outer covering is the conductor (referred to as an outer covering conductor) 1a connected to the ground and the core 1b to become a signal line is formed across an insulator 1c.

When the coaxial cable 1 is connected to the printed wiring board 2, the outer covering conductor 1a of the coaxial cable 1 is fitted in the cutout space 4 of the printed wiring board 2. That is, the cutout space 4 serves as a guide for mounting the coaxial cable 1.

At this time, there is brought about a state where the core 1b is put on the mounting electrode 10b of the signal line 10 formed on the printed wiring board 2.

As shown in FIGS. 2C and 2D, the outer covering conductor 1a and the mounting electrode 11b of the ground line 11 are electrically connected to each other by solder 12 and the core 1b and the mounting electrode 10b of the signal line 10 are electrically connected to each other by solder 12, whereby the contact probe 100 is completed.

In this regard, in the contact probe in accordance with the present invention, the form of the above-described probe tip, that is, the printed wiring board 2 is not necessarily limited to the form shown in FIG. 2.

Figure 3A:
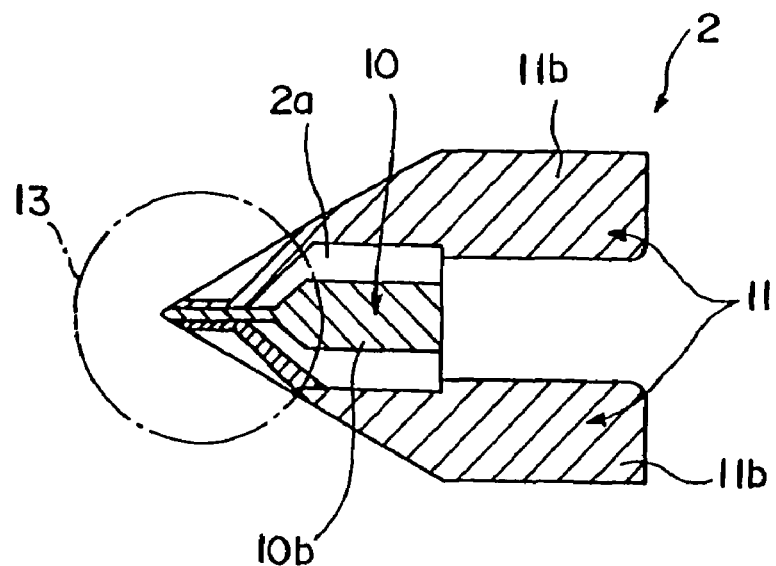
FIG. 3 is a plan view showing another embodiment of the tip of the contact probe in FIG. 1.
Figure 3B:
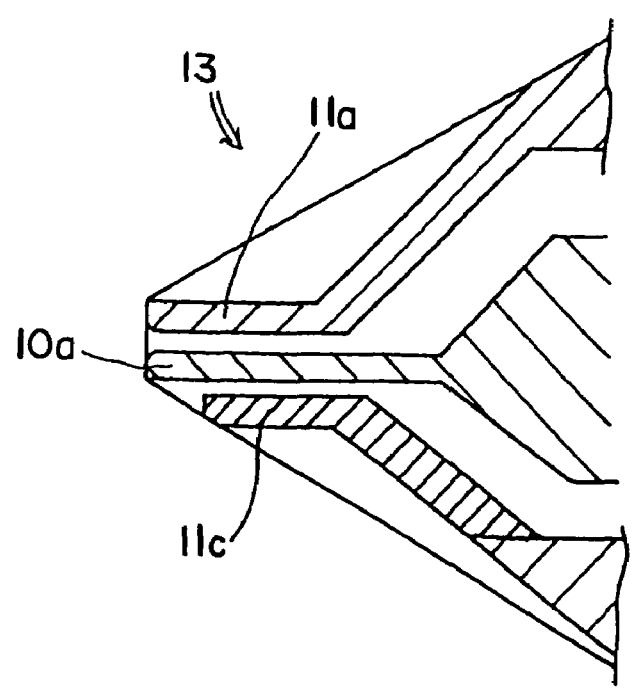

For example, as shown in FIG. 3, a ground line 11c connected to the mounting electrode 11b may be formed. Here, in FIG. 3, FIG. 3A is a plan view showing the whole of the printed wiring board 2 and FIG. 3B is a partial enlarged view in FIG. 3A and is a plan view showing the periphery of the contact portion.

The printed wiring board 2 shown in FIG. 3 is different only in the periphery of the contact portion from the embodiment shown in FIG. 2 and, as described above, the ground line 11c is formed opposite to the ground electrode 11a across the signal electrode 10a. Here, the pitch between the signal electrode 10a and the ground line 11c is 20 µm as large as the pitch between the contact electrodes.

With this, the impedance of the signal line in the signal electrode 10a can be reduced to a small value with stability and hence a measurement on a signal from the contact electrode can be made with high accuracy.

Further, as shown in FIG. 3B, the tip of the signal electrode 10a, which is the contact electrode, and a position of the tip of the ground electrode 11a are formed to the same length. On the other hand, a position of the tip of the ground line 11c is formed to be inside compared to the tips of the signal electrode 10a and the ground electrode 11a.

That is, when the contact electrode comes into contact with an object to be measured, the ground line 11c does not interfere with (come into contact with) the object to be measured.

When the ground line 11c is formed such that its tip position is the same as the tip position of the ground electrode 11a, the contact probe can be also suitably used as a ground-signal-ground (GSG) type contact probe that is suitable for being in contact with a line of a coplaner waveguide (CPW) structure.

In the manufacturing of the printed wiring board 2 at the tip of the contact probe 100, for example, a semi-additive method (method of forming wirings by applying a copper plating to an insulating board) can be suitably used. A manufacturing process of the printed wiring board 2 will be described with reference to FIG. 4.

FIG. 4 shows a process of manufacturing a printed circuit board used for the tip of a probe shown in FIG. 2 or FIG. 3.

Figure 4A:
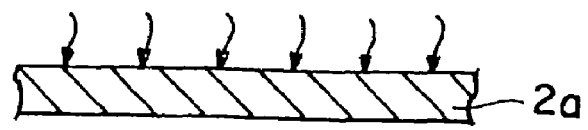
FIG. 4 shows a process of manufacturing a printed circuit board used for the tip of the probe shown in FIG. 2 and FIG. 3.
Figure 4B:
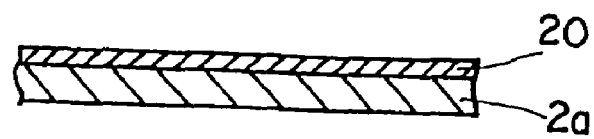

First, an insulating resin board 2a such as FR-4 (epoxy resin laminated board made of heat-resistant glass material), BT resin (made by Mitsubishi Gas Chemical Company, Inc.), liquid crystal polymer, Teflon, polyimide, or the like is prepared and its surface is subjected to a roughening and catalyzing processing (FIG. 4A). Then, a nonelectrolytic copper-plated film 20 is formed over the whole surface of the roughened and catalyzed board (FIG. 4B).

Figure 4C:
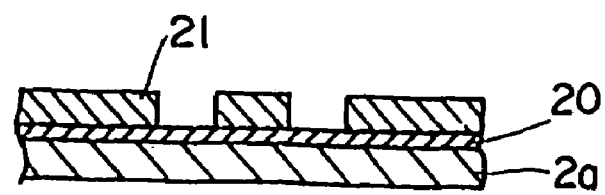
Figure 4D:
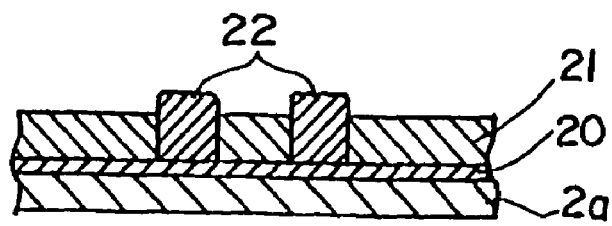

Next, a resist pattern 21 for forming fine wirings is formed by a lithography process (FIG. 4C). Then, an electrolytic plating film (fine copper wirings) 22 is formed over the nonelectrolytic copper-plated film 20 where the resist pattern 21 is not formed (FIG. 4D).

Here, it is because the height (thickness) of the copper fine wirings from the insulating resin board 2a is made larger that the electrolytic plated film (fine copper wirings) 22 is formed over the nonelectrolytic copper-plated film 20. This electrolytic plated film 22 can bring about a good contacting state when the tip of the contact probe 100 comes into contact with the object to be measured.

Figure 4E:
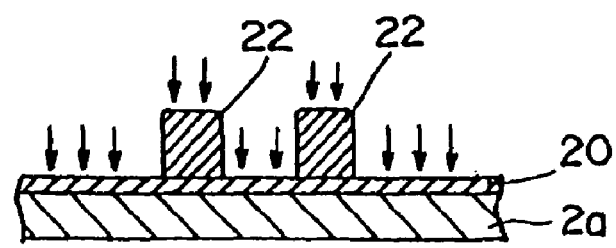
Figure 4F:
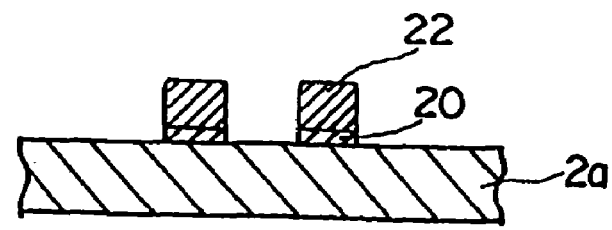

Next, the resist pattern 21 that becomes unnecessary is removed to expose the copper fine wirings 22 (FIG. 4E). Then, the nonelectrolytic copper-plated film 20 is removed by quick etching. At this time, the copper fine wirings 22 are also slightly etched off at the same time (FIG. 4F).

Figure 4G:
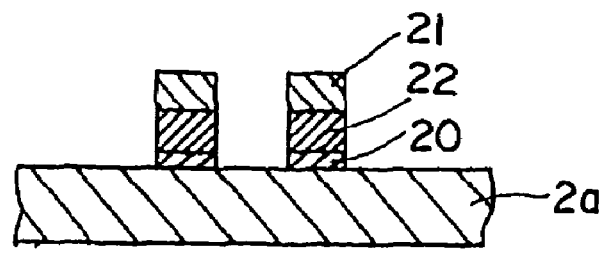
Figure 4H:
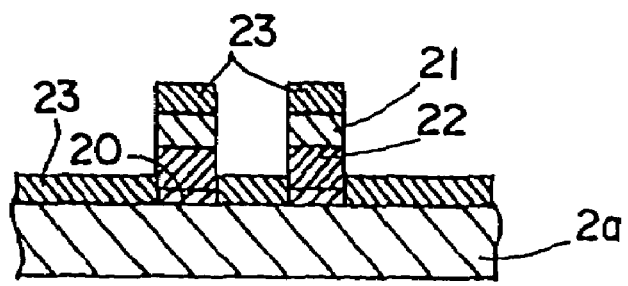

Next, a resist pattern 21 is formed over the copper fine wirings 22 by a lithography process to mask the copper fine wirings 22 (FIG. 4G). Then, an insulating layer 23 thinner than the copper fine wirings 22 is formed over the board by a coating method or a printing method using the insulating resin material such as epoxy, BT resin, liquid crystal polymer, or the polyimide, which is in a state of varnish dissolving in a solvent (FIG. 4H). The copper fine wirings 22 is nonelectrolytic gold-plated when necessary.

Figure 4I:
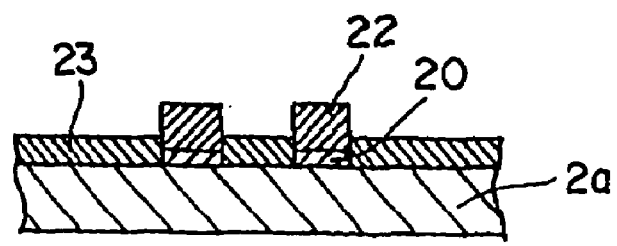

Next, the resist pattern 21 and the insulating layer 23 over the resist pattern 21 are dipped in the solvent, thereby being removed, whereby the fine lines are completed (FIG. 4I).

With the above-described process, a wiring pattern including the signal line 10 and the ground line 11 is formed on the insulating resin board 2a and then the board is cut at the final step, whereby the printed wiring board 2 is manufactured.

In this regard, in this embodiment, the line width of the contact electrode (signal electrode 10a, ground electrode 11a) is 10 µm and the pitch between the electrodes is 20 µm, but the line width can be arbitrarily selected when the printed wiring board 2 is manufactured.

However, a circuit pattern can be formed in a pitch of 10 µm or less by the present semi-additive method (method of forming wirings by applying the copper plating to the insulating board) and hence it is preferable that the contact electrodes (signal electrode 10a, ground electrode 11a) be formed in an inter-electrode pitch of 10 µm or more.

Further, as for the pitch between the electrodes, to bring the above-described good state of contact, it is preferable that the whole of the nonelectrolytic copper-plated film 20 and the copper fine wirings 22 be formed in a height (thickness) of from 5 µm to 20 µm.

Further, when both of the signal line and the ground line in a measuring point of the object to be measured are fine in the size of width, it is difficult to position the tip of the contact probe 100 with high accuracy and to put it at a correct position. In this case, it is possible to put the contact probe 100 at a correct position with ease by devising the shape of the electrode of the object to be measured.

Figure 5:
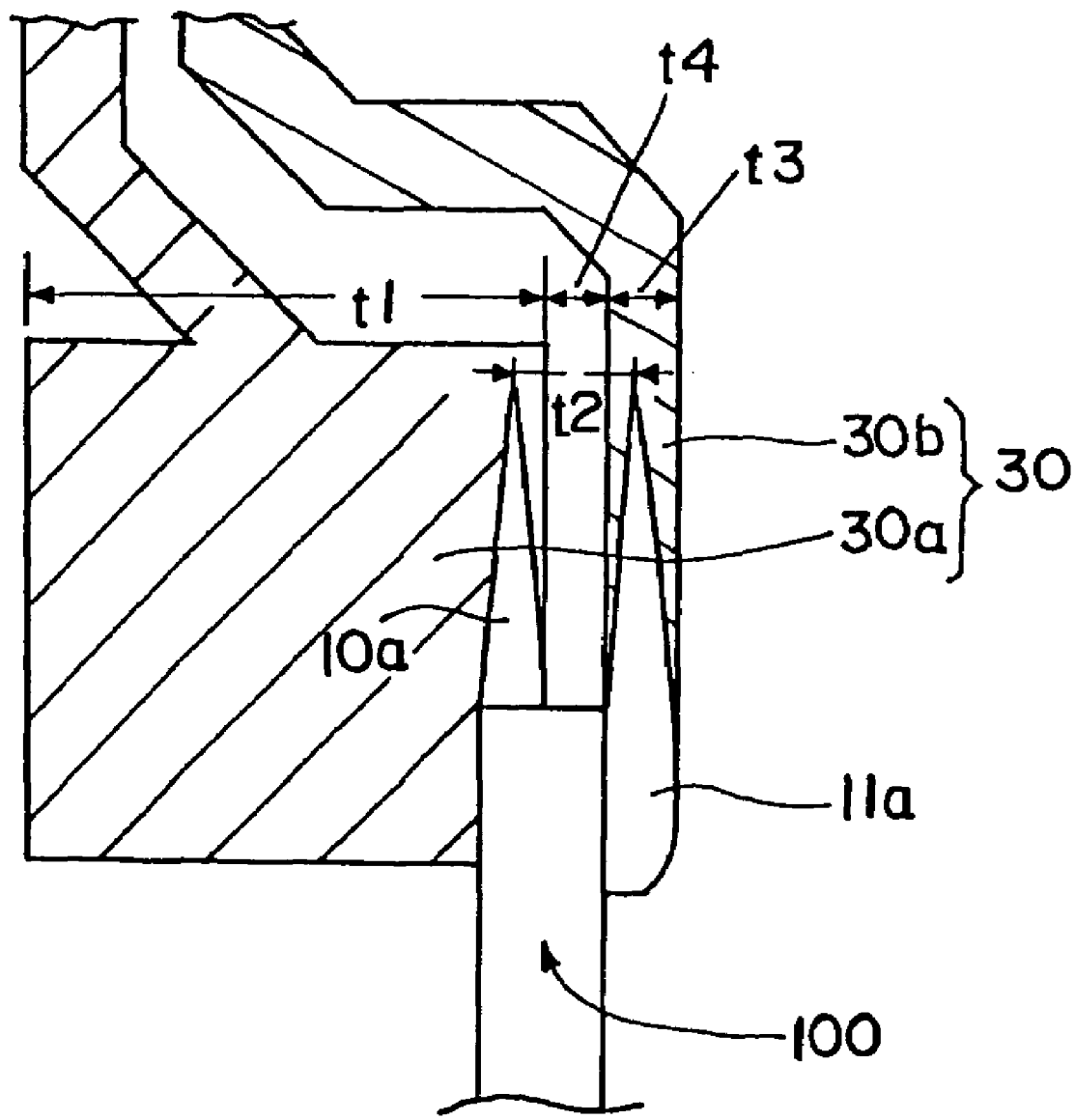
FIG. 5 is a plan view of a measuring pad disposed between an object to be measured and the contact probe in FIG. 1.

For example, as shown in FIG. 5, a measuring pad 30 formed in the object to be measured is constructed in such a way as to have the first bonding pad 30a and the second bonding pad 30b, which are respectively formed by printing, at the contact portion of the signal electrode 10a and the ground electrode 11a of the contact probe 100.

For example, the first bonding pad 30a with which the signal electrode 10a comes in contact is formed along the pitch between the signal electrode 10a and the ground electrode 11a in a width t1 of 1.5 times to 3 times as large as the pitch t2 between the electrodes. Further, the second bonding pad 30b with which the ground electrode 11a comes in contact is formed in a width t3 of 0.5 times or less as large as the pitch t2 between the electrodes. Still further, the pitch t4 between the first bonding pad 30a and the second bonding pad 30b is formed in a size of 0.5 times or less as large as the pitch t2 between the electrodes.

Because the first bonding pad 30a is formed in a large size in this manner, its position can be easily found when it is observed by a microscope. Hence, when a search is further made with attention concentrated on the contour line of the first bonding pad 30a, a gap between the first bonding pad 30a and second bonding pad 30b can be easily found. Further, because the first bonding pad 30a is formed in a width larger than the pitch t2 between the electrodes of the probe, when the tip (contact electrode) of the contact probe 100 is pressed onto the measuring pad 30, even if it is slightly shifted in position, the tip of the contact probe 100 can be put into correct contact with the measuring pad 30. It is also possible to employ a construction in which the signal electrode 10a and the ground electrode 11a are put into contact with the second bonding pad 30b and the first bonding pad 30a, respectively.

As described above, according to the embodiment in accordance with the present invention, in the above-described contact probe 100, it is possible to form the contact electrodes in an inter-electrode pitch between the electrodes is smaller than 50 μm on the above-described printed wiring board 2 and to put the tip of the probe onto the fine pitch formed on the semiconductor integrated circuit, the package for the semiconductor integrated circuit, printed circuit board, and the like.

Therefore, it is possible to realize a high-speed high-frequency measurement on a fine pitch by mounting the above-described contact probe 100 on the high-frequency measuring device.

Further, because the technology of manufacturing the printed wiring board 2 is used, it is possible to form the pitch between the electrodes in a desired value with ease and high accuracy.

Embodiment

Next, a contact probe in accordance with the present invention will be further described on the basis of an embodiment.

Embodiment 1

To study a contact probe in accordance with the present invention, a contact probe formed in the same construction as the above-described embodiment was manufactured and a high-frequency characteristics measurement test was conducted.

As an object to be measured was used a chip mounting package (board) 150 having fine wirings of a width of 10 μm and a pitch of 20 μm and having a differential pair strip line structure including two kinds of strips of a long strip of 1.2 mm long and a short strip of 12.4 mm long. Its plan view is shown in FIG. 6A and an A—A sectional view taken along a line A—A in FIG. 6A is shown in FIG. 6B, and an equivalent circuit of its floating electric parameter is shown in FIG. 6C.

Figure 6A:
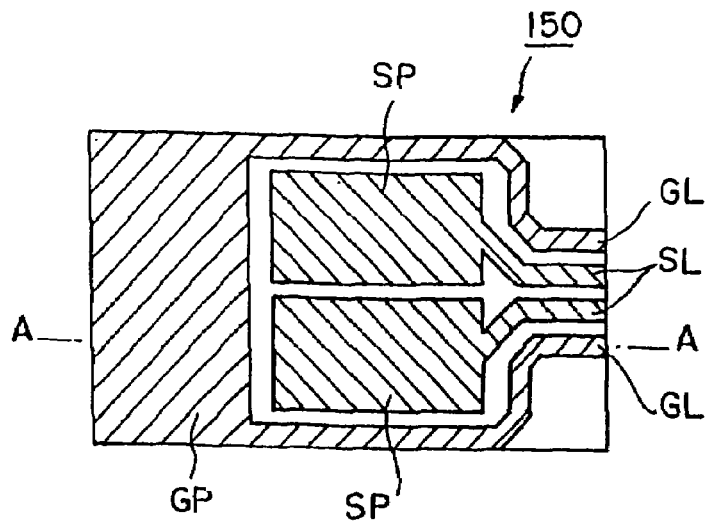
FIG. 6 schematically shows a chip mounting package (board) used in an embodiment.

As shown in FIG. 6A, the chip mounting package 150 used for the object to be measured has a ground pad GP and a signal pad SP, which are bonding pads, formed on its surface, and a ground line GL and a signal line SL are pulled out of these pads.

Figure 6B:
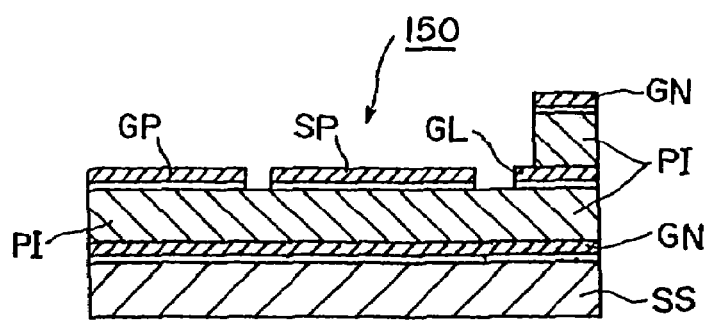

Further, as shown in FIG. 6B, the chip mounting package 150 has a multilayer wiring structure and insulating layers PI made of polyimide are laminated on a silicon board SS.

Figure 6C:
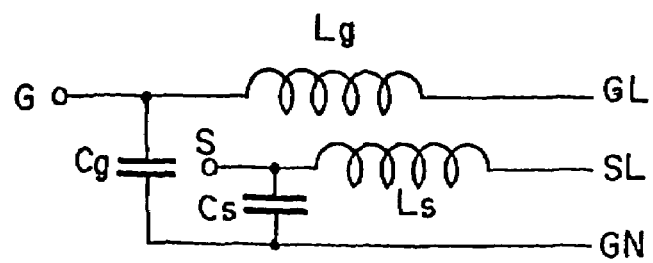

Still further, an equivalent circuit shown in FIG. 6C is such that considers a parasitic capacitance $C_s$ between a ground plane GN and a signal pad SP, a parasitic capacitance $C_g$ between the ground plane GN and a ground pad GP, and the parasitic inductance $L_s$ of the signal pad SP, and the inductance $L_g$ of the ground pad GP. Here, in this equivalent circuit, a reference symbol G denotes a ground terminal and S denotes a signal terminal.

Figure 7A:
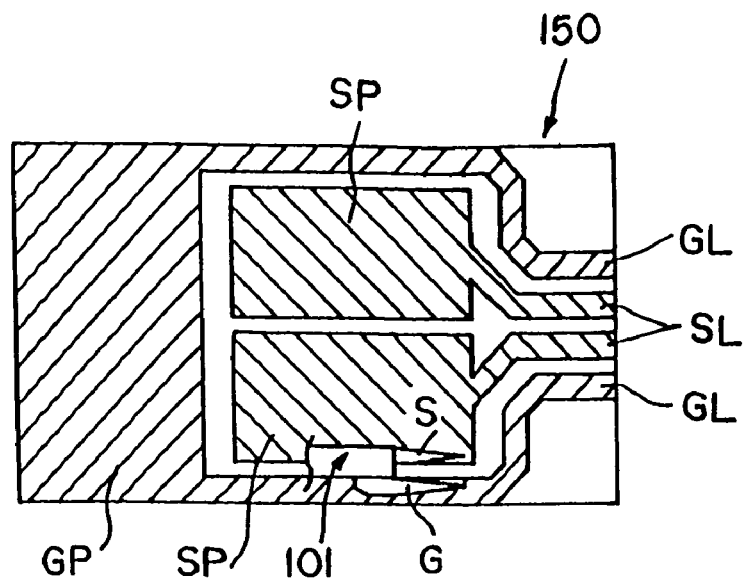
FIG. 7 is a view useful in explaining the outline of an embodiment and a graph showing a measurement result.

The tip of a contact probe 101 having the same construction as shown in the above-described embodiment was pressed onto the wiring pattern of the object to be measured, for example, as shown in FIG. 7A and high-frequency characteristics were measured and evaluated by a time domain reflectometry method (TDR).

Here, in the contact probe 101 in the drawing, a reference symbol S denotes a signal (electrode) and G denotes a ground (electrode). Further, a measurement was conducted on two kinds of long and short differential pair strip lines of a strip line (short) of 1.2 mm long and a strip line (long) of 12.4 mm long.

Figure 7B:
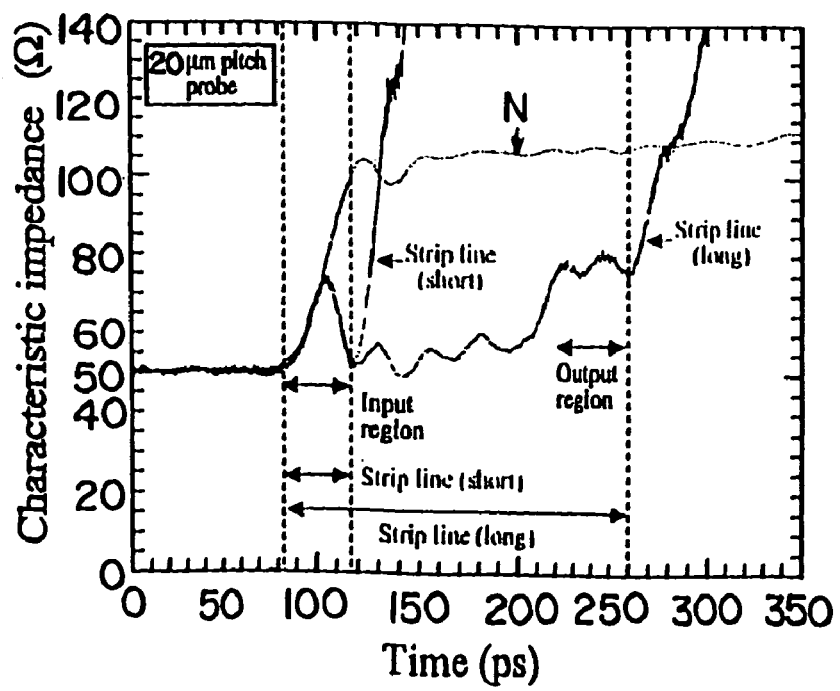

The distribution of characteristic impedance as a measurement result is shown as a graph in FIG. 7B. In this graph, the time of the horizontal axis corresponds to a position in a measuring line and a rising position of a TDR waveform N of a standard voltage in a state where the tip of the probe is opened corresponds to the starting point of the measuring line.

In FIG. 7B, as shown as the results of the strip line (short) of 1.2 mm long and the strip line (long) of 12.4 mm long, the distribution of characteristic impedance of the line could be correctly measured and evaluated.

That is, it was thought that this was because the tip of the probe 101 having a pitch of 20 μm was pressed onto a portion where the signal pad SP and the ground pad GP (or ground line GL) were brought closer to each other to a minimum pitch to prevent the effect caused by the parasitic inductance L and the parasitic capacitance C shown in the equivalent circuit in FIG. 6C.

In this regard, the impedance of the line corresponding to the flat center portion of a waveform in the graph shown in FIG. 7B was evaluated to be 55 ohm±11%.

COMPARATIVE EXAMPLE 1

A high-frequency characteristic measuring test was conducted by the use of a conventional contact probe 200 having a pitch of 250 μm. Here, the above-described chip mounting package 150 was used as the object to be measured, just as with the case of the contact probe 101.

Figure 8A:
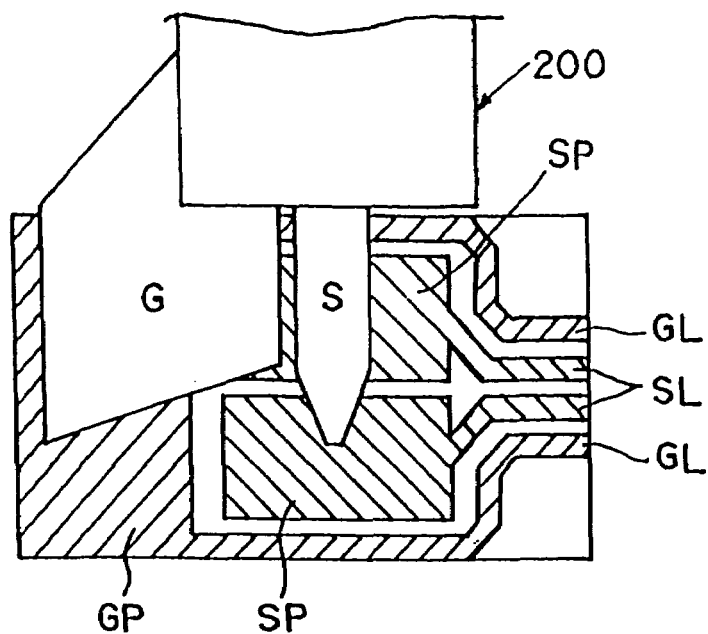
FIG. 8 is a view useful in explaining the outline of a comparative example and a graph showing a measurement result.

The tip of a contact probe 200 was pressed onto the pad portion of the object to be measured, for example, as shown in FIG. 8A, and high-frequency characteristics were measured and evaluated by the time domain reflectometry method (TDR).

Here, in the contact probe 200 in the drawing, a reference symbol S denotes a signal (electrode) and G denotes a ground (electrode). Further, a measurement was conducted on one of two kinds of long and short differential pair strip lines of a strip line (short) of 1.2 mm long and a strip line (long) of 12.4 mm long.

Figure 8B:
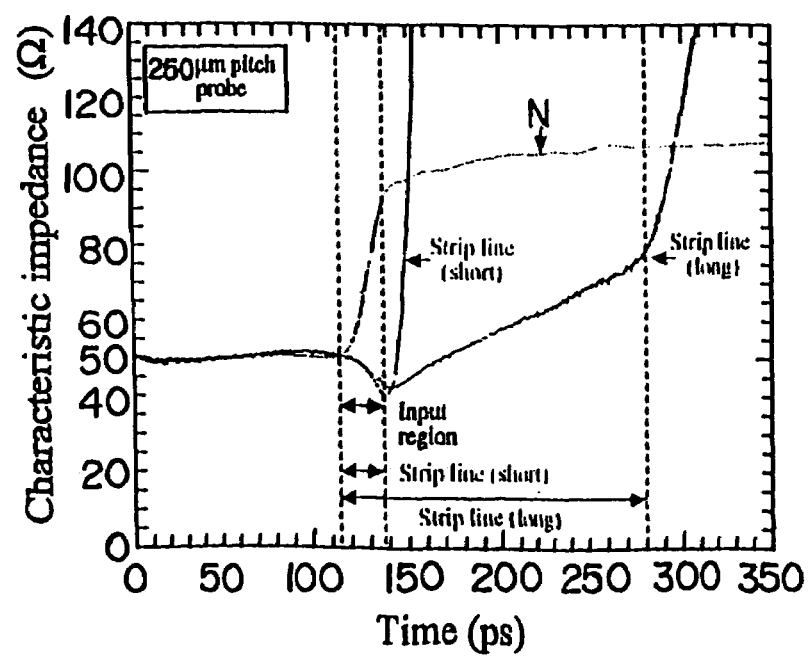

The distribution of characteristic impedance as a measurement result is shown as a graph in FIG. 8B. As shown in this graph, the distribution of the characteristic impedance of the line could not correctly measured and evaluated as compared with the graph shown in FIG. 7B.

That is, it was thought that this was because the effect of the parasitic inductance L and the parasitic capacitance C prevented the component of a TDR signal of high speed (over GHz) from reaching the measuring line to cause a shortage of positional resolution.

From the above results of the embodiment, it was determined that high-speed high-frequency measurement at fine pitches of 20 μm, which was smaller than 50 μm, could be correctly conducted in the semiconductor integrated circuit, the package for the semiconductor integrated circuit, the printed circuit board, and the like by the use of the contact probe in accordance with the present invention.

What is claimed is:

1. A method of manufacturing a contact probe used for measuring and evaluating high-speed high-frequency characteristics, the method comprising the steps of:

manufacturing a printed wiring board on which wirings of a signal electrode and a ground electrode, which are put into contact with an object to be measured, are formed; and electrically connecting the signal electrode to a core of a coaxial cable and electrically connecting the ground electrode to an outer covering conductor of the coaxial conductor, wherein in the step of manufacturing the printed wiring board, an inter-electrode pitch between the signal electrode and the ground electrode is formed in a size of from 10 μm or more to less than 50 μm.

2. The method of manufacturing a contact probe according to claim 1, wherein the step of manufacturing a printed wiring board comprises the steps of:

roughening and catalyzing a surface of an insulating resin board;

forming a nonelectrolytic copper-plated film over the whole surface of the roughened and catalyzed board after the step;

forming a resist pattern for forming a fine wiring by a lithography process after the step of forming the film;

forming an electrolytic copper-plated film on the nonelectrolytic copper-plated film, on which the resist pattern is not formed, after the step of forming a resist pattern for forming a fine wiring;

removing the resist pattern after the step of forming an electrolytic copper-plated film to expose the nonelectrolytic copper-plated film and the electrolytic copper-plated film, which become copper fine wirings; and etching off an unnecessary nonelectrolytic copper except for the copper fine wirings after the step of removing the resist pattern.

* * * * *